United States Patent
Burger (10) Patent No.: US 9,442,534 B2
(45) Date of Patent: Sep. 13, 2016

(54) ELECTRODE DEVICE FOR A CAPACITIVE SENSOR DEVICE FOR POSITION DETECTION

(71) Applicant: Microchip Technology Germany II GmbH & Co. KG, Gilching (DE)

(72) Inventor: Stefan Burger, Munich (DE)

(73) Assignee: Microchip Technology Germany II GmbH & Co. KG, Rosenheim (DE)

( * ) Notice: Subject to any disclaimer, the term of this patent is extended or adjusted under 35 U.S.C. 154(b) by 0 days.

(21) Appl. No.: 14/353,072

(22) PCT Filed: Oct. 17, 2012

(86) PCT No.: PCT/EP2012/070602
§ 371 (c)(1),
(2) Date: Apr. 21, 2014

(87) PCT Pub. No.: WO2013/057159
PCT Pub. Date: Apr. 25, 2013

(65) Prior Publication Data
US 2015/0145814 A1 May 28, 2015

(30) Foreign Application Priority Data
Oct. 21, 2011 (DE) .......................... 10 2011 054 690

(51) Int. Cl.
*G06F 1/16* (2006.01)
*G06F 3/044* (2006.01)
*H03K 17/955* (2006.01)

(52) U.S. Cl.
CPC ............. *G06F 1/169* (2013.01); *G06F 3/044* (2013.01); *H03K 17/955* (2013.01); *G06F 2203/04101* (2013.01)

(58) Field of Classification Search
CPC ..................... G06F 1/169; G06F 2203/04101; G06F 3/044; H03K 17/955
USPC ........................ 345/169, 173–174; 178/18.06
See application file for complete search history.

(56) References Cited

U.S. PATENT DOCUMENTS

| 4,633,249 A | 12/1986 | Sasaki ...................... 340/870.37 |
| 4,743,902 A | 5/1988 | Andermo ...................... 324/660 |

(Continued)

FOREIGN PATENT DOCUMENTS

| DE | 2318581 A | 10/1973 | ............... G06F 3/02 |
| DE | 2853142 A1 | 6/1979 | ............... G01D 5/24 |

(Continued)

OTHER PUBLICATIONS

International Search Report and Written Opinion, Application No. PCT/EP2012/070602, 9 pages, Feb. 22, 2013.

(Continued)

*Primary Examiner* — Hong Zhou
(74) *Attorney, Agent, or Firm* — Slayden Grubert Beard PLLC (57) ABSTRACT

An electrode device for a capacitive sensor device for detecting a position of an object relative to the electrode device, wherein the electrode device has a transmitting electrode configuration, a receiving electrode configuration and at least one ground electrode, wherein the transmitting electrode configuration, the receiving electrode configuration and the at least one ground electrode are arranged one upon the other and spaced from each other, at least one ground electrode is arranged between the transmitting electrode configuration and the receiving electrode configuration, and the transmitting electrode configuration has a first transmitting electrode, which may be loaded with an electric alternating signal. Further provided is a printed circuit board that has such an electrode device as well as a handheld device with such a printed circuit and a handheld device with a capacitive sensor device with such an electrode device.

23 Claims, 9 Drawing Sheets

(56) References Cited

U.S. PATENT DOCUMENTS

| | | | |
|---|---|---|---|
| 5,767,686 A | 6/1998 | Kespohl | 324/662 |
| 6,859,141 B1* | 2/2005 | Van Schyndel | G01S 13/04 324/658 |
| 7,821,275 B2 | 10/2010 | Wuerstlein et al. | 324/663 |
| 8,228,077 B2 | 7/2012 | Wuerstlein et al. | 324/686 |
| 8,421,482 B2 | 4/2013 | Wuerstlein et al. | 324/663 |
| 2002/0154039 A1 | 10/2002 | Lambert et al. | 341/33 |
| 2005/0030724 A1 | 2/2005 | Ryhanen et al. | 361/760 |
| 2005/0122119 A1* | 6/2005 | Barlow | 324/662 |
| 2006/0016800 A1* | 1/2006 | Paradiso et al. | 219/497 |
| 2008/0074398 A1* | 3/2008 | Wright | 345/173 |
| 2008/0164076 A1* | 7/2008 | Orsley | 178/18.01 |
| 2009/0009485 A1* | 1/2009 | Bytheway | 345/174 |
| 2009/0079707 A1* | 3/2009 | Kaehler | G06F 3/044 345/174 |
| 2009/0127005 A1* | 5/2009 | Zachut | G06F 3/044 178/18.03 |
| 2009/0135157 A1* | 5/2009 | Harley | 345/174 |
| 2009/0146827 A1 | 6/2009 | Wuerstlein et al. | 340/657 |
| 2010/0079269 A1 | 4/2010 | Hammerschmidt et al. | 340/436 |
| 2010/0110038 A1* | 5/2010 | Mo | G06F 3/044 345/174 |
| 2011/0018557 A1* | 1/2011 | Badaye | 324/658 |
| 2011/0175671 A1* | 7/2011 | Reynolds | 327/517 |

FOREIGN PATENT DOCUMENTS

| | | | |
|---|---|---|---|
| DE | 3418566 A1 | 11/1984 | G01D 5/241 |
| DE | 202006013335 U1 | 1/2008 | E05F 15/20 |
| DE | 202006015740 U1 | 2/2008 | E05F 15/20 |
| DE | 102006053572 B3 | 7/2008 | E05F 15/20 |
| DE | 202007016734 U1 | 4/2009 | E05F 15/20 |
| EP | 0734986 A2 | 10/1996 | B65H 23/02 |
| EP | 2228905 A1 | 9/2010 | G01D 5/24 |
| WO | 2013/057159 A1 | 4/2013 | H03K 17/955 |

OTHER PUBLICATIONS

European Office Action, Application No. 12778289.4, 5 pages, Jun. 2, 2015.

Taiwan Office Action, Application No. 101138784, 11 pages, Jun. 2, 2016.

Chinese Office Action, Application No. 201280051475.2, 8 pages, Jun. 30, 2016.

* cited by examiner

ELECTRODE DEVICE FOR A CAPACITIVE SENSOR DEVICE FOR POSITION DETECTION

CROSS-REFERENCE TO RELATED APPLICATIONS

This application is a U.S. National Stage Application of International Application No. PCT/EP2012/070602 filed Oct. 17, 2012, which designates the United States of America, and claims priority to DE Patent Application No. 10 2011 054 690.1 filed Oct. 21, 2011. The contents of which are hereby incorporated by reference in their entirety.

TECHNICAL FIELD

The invention relates to an electrode device for a capacitive sensor system, in particular for detecting a position of an object relative to the electrode device.

BACKGROUND

In capacitive sensor systems, in particular capacitive proximity sensors, the approach of an object, for example of a finger towards a sensor zone substantially is measured contactless by means of generating and measuring electric alternating fields. Derived from the measurement signal may be functions, for example switching functions, of an electric device, in particular an electric handheld device.

There is a need to provide, for example at an electric handheld device, sensor zones of a capacitive sensor system, wherein during an approach of an object towards a sensor zone not only the approach of the object towards the sensor zone but also the position of the object relative to the sensor zone may be detected.

Depending on the position of the object relative to the sensor zone different functions may be carried out in the electric handheld device. In doing so, a preferably high position resolution is desired. In order that the capacitive sensor system may be applied to different electronic devices, it is further desirable, when the capacitive sensor system preferably is independent of the grounding state of the respective electronic device. Known from prior art are electrode configurations, in particular for capacitive sensor systems, which operate according to the so called loading method, wherein for example for implementing a sliding controller (in a sliding controller it is important that the position of an object, for example a finger, is detectable along the sliding controller) a plurality of sensor electrodes arranged side by side and adjacent, respectively, is provided. During operation of the capacitive sensor using the loading method only one sensor electrode is required, which represents a transmitting electrode as well as also a receiving electrode.

An electric alternating signal is applied to the sensor electrode, so that an electric alternating field is emitted therefrom, wherein the capacitive load of the sensor electrode (for example by an approach of a finger towards the sensor electrode) is detected and evaluated, respectively, by means of an evaluation device. By means of the detected capacitive load it may be determined towards which sensor electrode an approach of the finger has taken place.

Such capacitive sensor systems, however, have the disadvantage that a great many electrodes are required for a high resolution (position resolution), which significantly increases the constructive effort for the production, for example of an capacitive sliding controller. In addition, the sensor signal is dependent on the grounding state of the sensor electronics.

In addition, capacitive sensor systems are known, which also have a great number of sensor electrodes, wherein it is required for an exact detection of the position that for example a finger simultaneously covers several sensor electrodes during contacting the sensor electrodes. Again, the constructive effort for the production here is raised significantly because of the great number of sensor electrodes required for a high position resolution.

Both solutions known from prior art in addition have the disadvantage that the electrodes substantially have to be arranged in one plane, for example at a housing surface of an electric device. However, it is desirable to not arrange the electrodes at the housing, for example to reduce the overhead for the production of the device.

SUMMARY

According to various embodiments, an electrode device can be provided for a capacitive sensor device for detecting a position of an object relative to the electrode device, which at least in part avoids the disadvantages known from conventional systems and which allows for a high position resolution with a preferably low number of sensor electrodes, wherein the detection of the position is independent of a grounding state of an electric device, for which the capacitive sensor device is provided, and wherein the electrode device does not have to be arranged at the housing of the electric device.

According to an embodiment, provided is an electrode device for a capacitive sensor device for detecting a position of an object relative to the electrode device, wherein the electrode device comprises a transmitting electrode configuration, a receiving electrode configuration and at least one ground electrode, wherein the transmitting electrode configuration, the receiving electrode configuration and the at least one ground electrode are arranged one upon the other and spaced from each other, at least one ground electrode is arranged between the transmitting electrode configuration and the receiving electrode configuration, and the transmitting electrode configuration comprises a first transmitting electrode, which may be loaded with an electric alternating signal.

Thereby it is feasible in an advantageous manner to also integrate an electrode device for detecting a position of an object relative to the electrode device into a multi layer PCB, wherein part of the electrically conductive layers of the multi layer PCB form the electrodes.

The transmitting electrode configuration may comprise a second transmitting electrode, which may be loaded with an electric alternating signal.

The electric alternating signal applied to the first transmitting electrode may be inverse with respect to the electric alternating signal applied to the second transmitting electrode.

The receiving electrode configuration at least may comprise one first receiving electrode and one second receiving electrode.

It is advantageous when the first transmitting electrode and the second transmitting electrode each comprise a number of electrode segments spaced from each other, which each are connected to each other electrically, wherein the electrode segments of both transmitting electrodes are arranged side by side such that an electrode segment of the second transmitting electrode is arranged between each two adjacent electrode segments of the first transmitting electrode.

The electrode segments of the two transmitting electrodes may have the same shape and the same surface area.

The first transmitting electrode may be arranged adjacent to the second transmitting electrode and spaced from the second transmitting electrode, wherein the first transmitting electrode preferably has a smaller electrode surface area than the second transmitting electrode and/or wherein the distance of the first transmitting electrode from an edge of a printed circuit board is smaller then the distance of the second transmitting electrode from the edge of a printed circuit board.

The first receiving electrode and the second receiving electrode each may comprise a number of electrode segments spaced from each other, wherein the electrode segments of both receiving electrodes are arranged side by side such that an electrode segment of the second receiving electrode is arranged between each two adjacent electrode segments of the first receiving electrode.

The first receiving electrode may be arranged above the second receiving electrode and spaced from the second receiving electrode.

It is advantageous when the width of the electrode segments of the first receiving electrode decreases along a detection axis and the electrode segments of the second receiving electrode each have the same width.

It is also advantageous when the width of the electrode segments of the first receiving electrode decreases along a detection axis, wherein the width of the electrode segments of the second receiving electrode increases along the detection axis.

The first receiving electrode may be arranged above of the second receiving electrode and spaced from the second receiving electrode, wherein the distance of the first receiving electrode and/or of the second receiving electrode from a detection edge decreases or increases along a detection axis.

The transmitting electrode configuration, the receiving electrode configuration and the at least one ground electrode each may be formed by parts of electrically conductive layers of a (multi-layered) printed circuit board that are arranged one upon the other.

The transmitting electrode configuration, the receiving electrode configuration and the at least one ground electrode may be arranged on the printed circuit board at edge thereof so that a capacitive coupling between the transmitting electrode configuration and the receiving electrode configuration preferably may be influenced by an object approaching the electrode device, wherein the device located at the edge is chosen such that at least one of the electrodes reaches to the edge of the printed circuit board.

Also provided is a printed circuit board, in particular a multi layer printed circuit board (multi layer PCB), comprising an electrode device according to various embodiments, wherein the electrodes of the electrode device each are formed by parts of the electrically conductive layers of the printed circuit board (LP) arranged one upon the other.

At least one of the electrodes may extend all the way to the completion edge of the printed circuit board, i.e. at least one electrode of the electrode device according to various embodiments is arranged in a location at the edge of the printed circuit board.

In addition a handheld device is provided by various embodiments, in particular an electric handheld device, comprising a printed circuit board according to various embodiments.

In addition, provided is a handheld device, in particular an electric handheld device, which has a capacitive sensor device, wherein the capacitive sensor device comprises an electrode device according to various embodiments.

The electric device and electric handheld device, respectively, may be a smart phone, a mobile radio device, a computer mouse, a device remote control, a digital camera, a game controller, a mobile mini-computer, a tablet-PC, a dictating device, a media player or the like.

BRIEF DESCRIPTION OF THE DRAWINGS

Details and characteristics of various embodiments result from the following description together with the drawing.

DETAILED DESCRIPTION

The sensor system according to various embodiments for detecting a position of an object relative to an electrode device of the sensor system is carried out as a capacitive sensor, which is operated in the operating mode "absorption".

Figure 1:
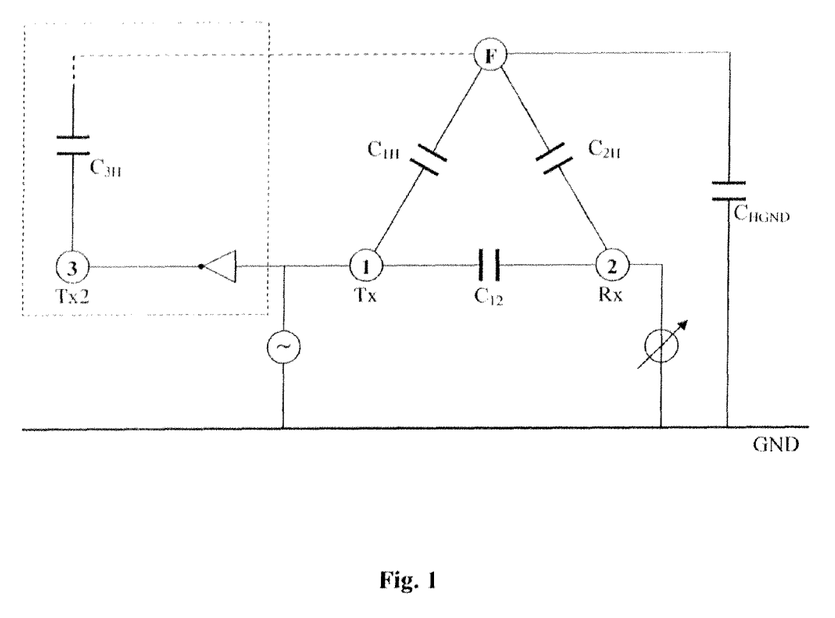
FIG. 1 shows an equivalent circuit diagram of a capacitive sensor system for illustrating the absorption effect.

The operating mode "absorption" is described in more detail with respect to FIG. 1.

In addition the sensor system according to various embodiments is designed such that the sensor signals of the sensor system provide two informations, namely:

1. how large is the sensor surface area and how large is the sensor length, respectively, of the electrode configuration that a user covers with his/her finger, and 2. at which position has the user contacted the electrode configuration with his/her finger.

FIG. 1 shows an equivalent circuit diagram of a capacitive sensor system for illustrating the absorption effect and for illustrating the measures by means of which the sensor system is rendered independent of the grounding state of the sensor system.

The electrodes Tx (transmitting electrode) and Rx (receiving electrode) are arranged side by side so that a basic capacitive coupling $C_{12}$ is formed between them. During an approach of a hand or of a finger F towards the electrodes Tx, Rx the basic capacitive coupling $C_{12}$ becomes smaller (absorption) so that the current flowing through $C_{12}$ also becomes smaller.

The capacitive coupling between electrode Tx and the finger F is labeled $C_{1H}$, the capacitive coupling between Rx and the finger is labeled $C_{2H}$. During an approach of the finger F towards the electrodes Tx, Rx the coupling capacities $C_{1H}$ and $C_{2H}$ become larger. By means of that a current path parallel to $C_{12}$ is formed between electrode Tx and electrode Rx, which may be interpreted as transmission.

This current path parallel to $C_{12}$ has to be reduced by means of suitable measures, preferably has to be avoided, as described in the following:

a) It also may be attempted to render $C_{HGND}$ (the capacitive coupling between finger F and ground GND) substantially larger than $C_{1H}$ (or to connect the finger F fixedly with ground GND). By means of that it is substantially achieved that the current flowing from electrode Tx via $C_{1H}$ to finger F does not flow to electrode Rx via $C_{2H}$. In fact, in doing so the transmission Tx→Rx is largely avoided, however, the sensor system further on is dependent on the grounding characteristics of the sensor system.

b) In addition, a second transmitting electrode Tx2 is provided, which mainly may be brought into a capacitive coupling $C_{3H}$ with the approaching finger F. The second transmitting electrode TX2 preferably is arranged relative to the receiving electrode Rx such that the capacitive coupling between the second transmitting electrode Tx2 and the receiving electrode Rx is negligible. The second transmitting electrode Tx2 is loaded with a generator signal, which preferably is inverse with respect to the generator signal applied to the first transmitting electrode Tx. Thereby it is accomplished substantially that the current flowing from electrode Tx to finger F via $C_{1H}$ in turn directly drains off via $C_{3H}$. A further flow of the current flowing from electrode Tx via $C_{1H}$ to finger F forward to electrode Rx via $C_{2H}$ such is avoided. In the embodiment of the electrodes it has to be considered that the coupling capacities $C_{1H}$ and $C_{3H}$ substantially are equal. This may be accomplished by an approximately equal electrode width of the first electrode Tx and the second electrode Tx2. Thus, the sensor system also is independent of the grounding characteristics of the sensor system.

In order to accomplish that the sensor system substantially is independent of the grounding state in the preferred embodiment two transmitting electrodes +Tx (labeled with Tx in FIG. 1) and −Tx (labeled with Tx2 in FIG. 1) are operated simultaneously, wherein the transmit signals and the generator signals, respectively, which are applied to the electrodes +Tx and −Tx, are inverse with respect to each other, i.e. the sum of the alternating parts of the electrode signals +Tx and −Tx is zero.

By means of the layout of the sensor system and of the electrodes, respectively, it is taken care of that during contacting the capacitive coupling of +Tx to the finger F of the user in an ideal case exactly shows the same amount as the capacitive coupling of −Tx to the finger F. Thereby, the coupling +Tx→F substantially is neutralized by the coupling −Tx→F.

With non-grounded measurement electronics it is prevented by means of this design that a current flows from the finger of the user to the electrode Rx (transmission) and in doing so falsifies the measurement signal of the absorption.

With a grounded measurement electronics, due to the principle, the current flowing from finger F of the user to electrode Rx (transmission) is negligible small, so that it is ensured that independent of the grounding state no transmission current is flowing. Thereby the sensor signal is independent of the grounding state. As a result, a capacitive sensor system (position sensor) thereby is provided in the operating mode absorption, which virtually leads to the same results in grounded and non-grounded sensor electronics.

The receiving electrode Rx is designed such and arranged such relative to the transmitting electrodes +Tx, −Tx, respectively, that a capacitive coupling substantially only exists with one of the transmitting electrodes +Tx or −Tx.

In an alternative embodiment of the sensor system it is also feasible that the transmission current by means of a respective sensor layout and a respective thickness of the isolating layer is reduced such that also a sensor system only comprising one transmitting electrode +Tx may be formed, which is largely independent of the grounding state.

When the grounding state (grounded or non-grounded) of the sensor system is known and largely constant, then the sensor system also may be formed comprising only one active transmitting electrode +Tx.

In order to implement a capacitive sliding controller the electrode device according to various embodiments of the capacitive sensor device is configured such that two received signals may be tapped and measured at the receiving electrode configuration. In an embodiment the receiving electrode configuration comprises two individual receiving electrodes. In a further embodiment the receiving electrode configuration comprises two receiving electrodes, which each are formed by means of a number of electrode segments. According to various embodiments, the receiving electrodes of the receiving electrode configuration according to various embodiments may be sub-divided into two types. The functional operation of the two types of receiving electrodes is described below in more detail.

According to various embodiments a receiving electrode configuration for a capacitive sliding controller may be formed by a combination of a receiving electrode of the first type and a receiving electrode of the second type. Alternatively, a receiving electrode configuration also may be formed comprising two receiving electrodes of the second type.

The combination of a receiving electrode of the first type with a receiving electrode of the second type has the advantage that in the idle state or waiting state (i.e. when the sensor is not active) of the sensor only the sensor signal and the received signal, respectively, of the receiving electrode of the first type has to measured and evaluated, respectively, in order to detect whether a user touches the sensor. Thereby, in particular in applications in which the received power shall be as low as possible, current may be saved. Only after a contact has been detected a received signal of the receiving electrode of the second type may be tapped and evaluated to detect the current position of an object, for example a finger, relative to the electrode device.

In contrast, the combination of two receiving electrodes of the second type has the advantage that the useful signal is twice as large, so that the signal to noise ratio also is respectively large. An additional advantage is that the measurement result is more linear without further technical measures than in a combination of a receiving electrode of the first type and a receiving electrode of the second type.

In the following the receiving electrodes of the first type and of the second type are described in more detail. In addition it is described in more detail how the position of an object relative to an electrode device according to various embodiments may be calculated when a receiving electrode of the first type is combined with a receiving electrode of the second type and when two receiving electrodes of the second type are combined.

Electrode device comprising a receiving electrode of the first type:

An electrode device comprising a receiving electrode of the first type, independent of the position of an object relative to the electrode device, for example a finger, produces a signal, which is approximately proportional with respect to the covered electrode length and electrode surface area, respectively. At contacting of the electrode device (in practice the electrodes of the electrode device may be covered with a layer of isolating material) the coupling capacity is changing at the respective position. The difference of the capacitance values at non-contacting of the electrode device and at contacting of the electrode device may be used as the measurement signal.

In the absorption mode the coupling capacity between the transmitting electrode Tx and the receiving electrode Rx (see FIG. 1) is reduced according to the following rule:

$$\Delta C = K1 * L,$$

wherein K is a proportionality factor and L the length of the exposure, so that: $\Delta C$ is proportional to length L.

A detection of the exposure also may be provided to bring the capacitive sensor device from a first operating mode into a second operating mode, for example from a sleep mode into an active mode. For this purpose, a predetermined threshold value may be provided, which has to be exceeded before a change of the operating mode is carried out. For example, the threshold value may comprise a minimum exposure and/or a minimum duration of an exposure.

Electrode device comprising a receiving electrode of the second type:

An electrode device according to various embodiments comprising a receiving electrode of the second type depending on the position of an object, for example a finger, relative to the electrode device provides a signal, which is approximately proportional to the covered electrode length and electrode surface area, respectively, and in addition is approximately proportional to the position P of the object relative to the electrode device. When the electrode configuration is touched (in practice the electrodes of the electrode configuration may be covered with a layer of isolating material) the coupling capacity at the respective position changes. As a measurement signal the difference of the capacitance values between not touching the electrode device and touching the electrode device may be used.

In the absorption mode the coupling capacity between the transmitting electrode Tx and the receiving electrode Rx (see FIG. 1) is reduced according to following rule:

$$\Delta C = K2 * P * L,$$

wherein K is a proportionality factor, P is the position of the finger relative to the electrode device and L is the length of the exposure, so that: $\Delta C \sim L*P$ (i.e. $\Delta C$ is proportional to L as well as also to P).

Calculations of the position of an object relative to the electrode device in a combination of a receiving electrode of the first type with a receiving electrode of the second type:

As described above, the receiving electrode of the first type approximately provides $$\Delta C_1 = K1 * L.$$

The receiving electrode of the second type approximately provides $$\Delta C_2 = K2 * P * L.$$

The position of the object relative to the electrode device results from the quotient $$\Delta C_2 / \Delta C_1 = P * K2 / K1.$$

The result of the calculation itself here is independent of the exposure. This means that the position substantially is correctly detected and determined, respectively, independent of the width of the finger covering the electrodes (finger of a child or finger of an adult), independent of the variation of the width of the exposure (for example when the width of an object changes while the object is moved relative to the electrodes), independent of the distance or of a change in distance of the finger covering the electrodes, and in particular independent thereof whether a glove is used or not.

Calculation of the position of an object relative to an electrode device comprising two receiving electrodes of the second type:

As described above, a receiving electrode of the second type approximately provides $$\Delta C_2 = K2 * P * L.$$

According to various embodiments the two receiving electrodes of the second type are arranged reverse, i.e. along a detection axis the sensor signal tapped at the first receiving electrode decreases, while the sensor signal tapped at the other receiving electrode increases.

With respect to the first receiving electrode the electrode device approximately provides $$\Delta C_{2A} = K2 * P * L.$$

With respect to the second receiving electrode the electrode device approximately provides $$\Delta C_{2B} = K2 * P * (K3 - L).$$

The exposure of the electrode device by an object, for example a finger, is calculated from the sum of the two signals tapped at the receiving electrodes, wherein the result is independent of the length of the exposure. The difference of the two signals depends on 2×L, this is to mean of the position of the object relative to the electrode device.

The position is calculated from the quotient $$(\Delta C_{2A} - \Delta C_{2B}) / ((\Delta C_{2A} + \Delta C_{2B}))$$

The result of the calculation itself here is independent of the exposure.

Shown in the following and in relation to FIG. 2 to FIG. 8 are electrode configurations comprising different arrangements and embodiments, respectively, of the transmitting electrodes and the receiving electrodes.

For all of the electrode configurations shown in FIG. 2 to FIG. 8 the following applies:

The electrodes E1 and E2 are receiving electrodes of the receiving electrode configuration.

The electrodes E3 and E4 are transmitting electrodes of the transmitting electrode configuration.

Figure 2:
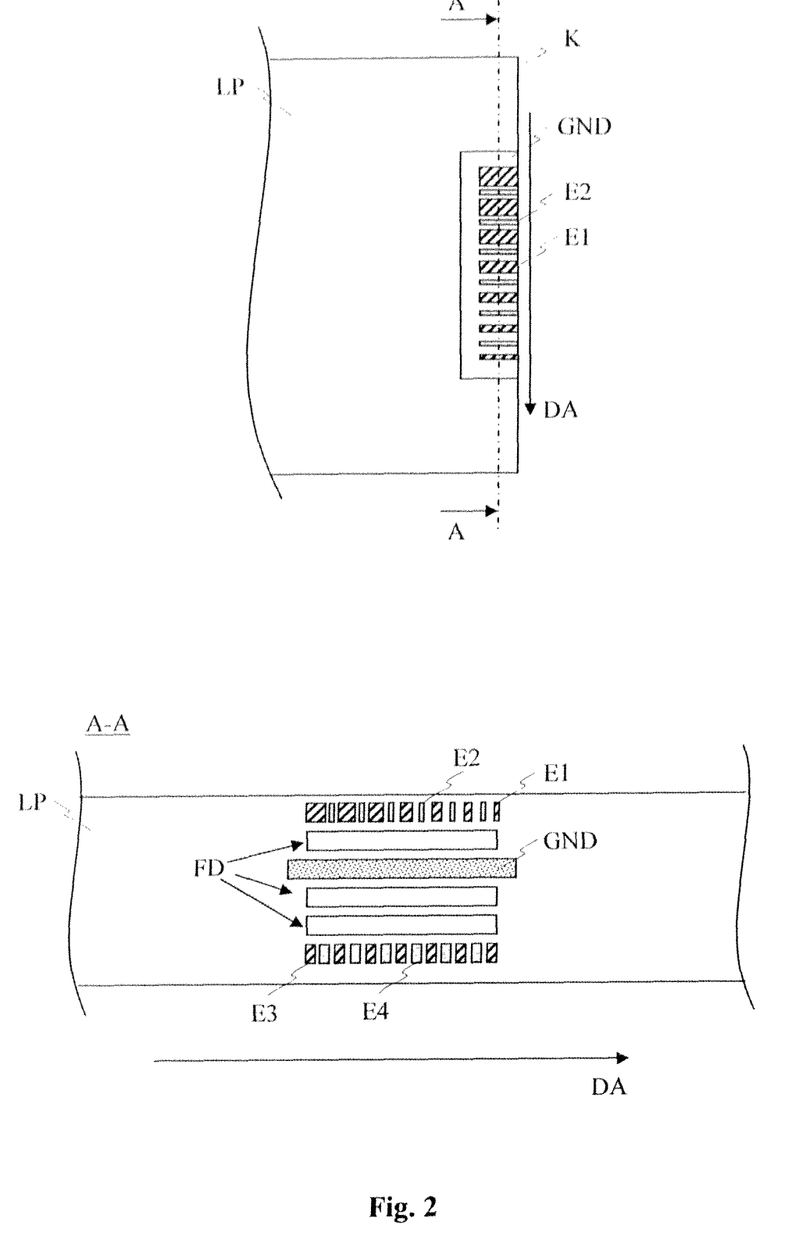
FIG. 2 shows a first exemplary embodiment of an electrode device.
Figure 3:
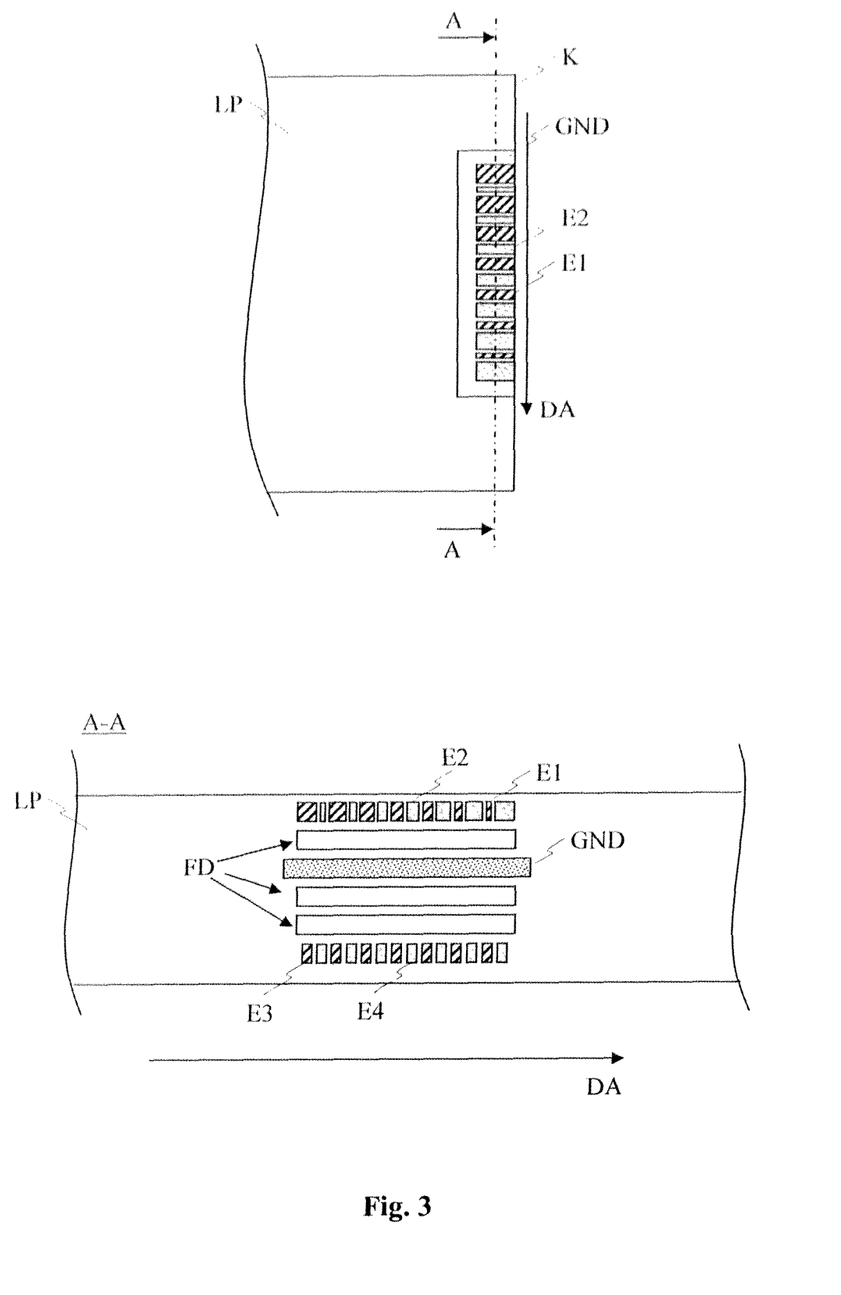
FIG. 3 shows a second exemplary embodiment of an electrode device.

In the electrode devices of FIG. 2 and FIG. 3 the transmitting electrodes E3 and E4 are activated opposite in phase, i.e. the transmitting electrodes E3 and E4 each are loaded with an electric alternating signal, wherein the electric alternating signal applied to the first transmitting electrode E3 is inverse with respect to the electric alternating signal applied to the second transmitting electrode E4. With the electrode devices of FIG. 4 to FIG. 8 there exist basically two possibilities for the operation of the respective transmitting electrodes: in a first variant the first transmitting electrode E3 may be loaded with a first electric alternating signal and the second transmitting electrode E4 may be loaded with a second electric alternating signal, wherein the first electric alternating signal is inverse with respect to the second electric alternating signal. In a second variant the first transmitting electrode E3 may be loaded with an electric alternating signal, while the second transmitting electrode E4 is operated as ground electrode, i.e. is coupled with ground of the capacitive sensor device.

By means of the inversely activated transmitting electrodes a detection of the position independent of the grounding state of the electric device and the capacitive sensor device, respectively, is ensured. However, it is a prerequisite that the coupling capacities between +Tx and the object F and −Tx and the object are equal in size (see FIG. 1, coupling capacity $C_{1H}$ between Tx and F as well as coupling capacity $C_{3H}$ between Tx2 and F). By means of the layout of the transmitting electrode configuration this prerequisite is met in the electrode devices according to FIG. 1 and FIG. 2. With the electrode devices according to FIG. 4 to FIG. 8 this is accomplished by means of the size ratio between the first transmitting electrode E3 and the second transmitting electrode E4. The size ratio and the selection of the respective electrode surface area of the transmitting electrodes E3 and E4 may be determined and optimized, respectively, in an experimental manner or also be carried out by means of field calculation.

The signals are tapped and evaluated successively at the receiving electrodes E1 and E2 of the receiving electrode configuration. However, it is also feasible to tap and evaluate the signals simultaneously.

Figure 8:
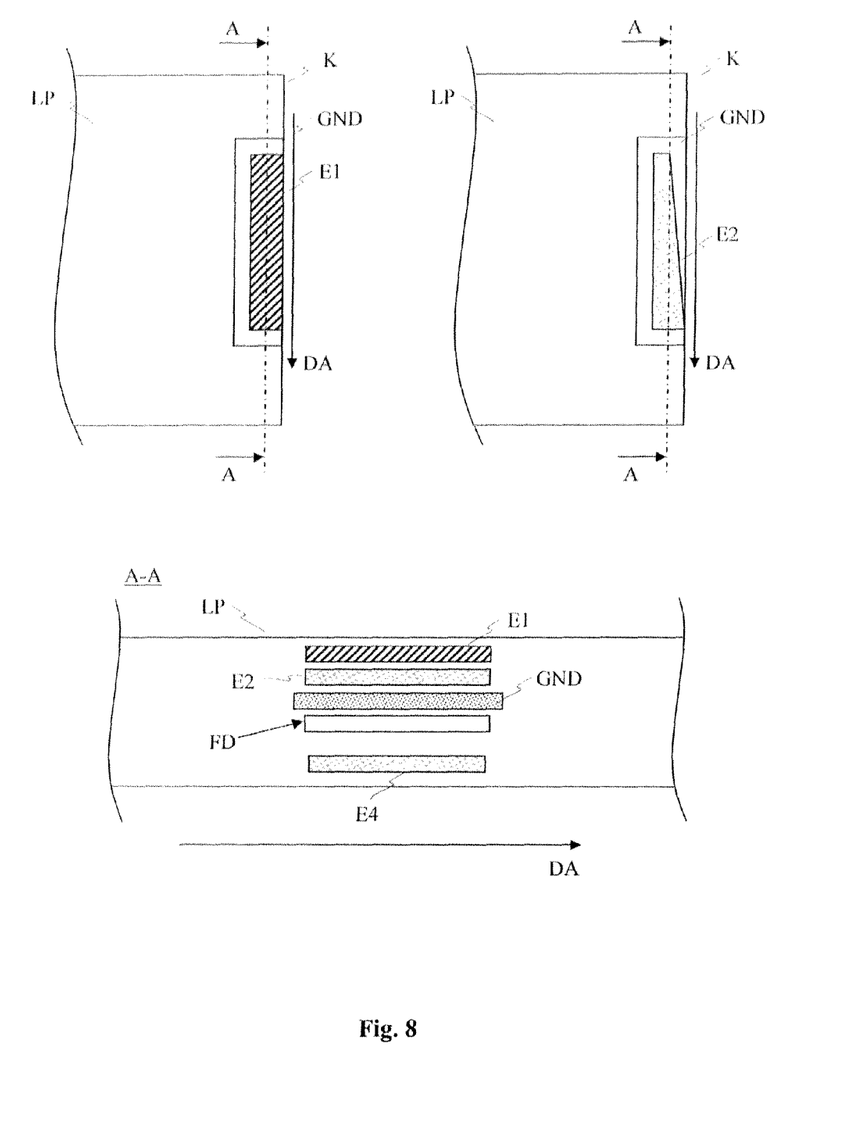
FIG. 8 shows a seventh exemplary embodiment of an electrode device.

In the electrode devices of FIG. 2 and FIG. 8 a receiving electrode provides a position independent signal by means of which a contact with the capacitive sensor may be detected (this electrode is a receiving electrode of the first type). The respective other receiving electrode of the receiving electrode configuration provides a position dependent signal (this electrode is a receiving electrode of the second type).

In the electrode devices of FIG. 3 to FIG. 7 both receiving electrodes E1 and E2 each provide a position dependent signal (i.e. both electrodes E1 and E2 are a receiving electrode of the second type), wherein the received signals are reversed with respect to the position as described above. The received signal of a receiving electrode increases along a detection axis, while the received signal of the other receiving electrode decreases along the detection axis.

Basically it is feasible with all of the electrode devices shown in FIG. 2 to FIG. 8 to combine a receiving electrode of the first type with a receiving electrode of the second type, or to combine two receiving electrodes of the second type.

In all of the electrode devices shown in FIG. 2 to FIG. 8 six planes arranged one on top of the other are illustrated respectively. Each electrode of the electrode configuration here is formed by parts of electrically conductive layers of a printed circuit board arranged one upon the other. In addition, the electrodes of the respective electrode device are arranged in the edge region of the printed circuit board, i.e. the electrodes of the respective electrode device are formed by means of electrically conductive layers of the printed circuit board arranged at the edge region of the printed circuit board, wherein the electrically conductive layers are arranged one upon the other and spaced from each other.

In doing so, it is accomplished substantially that no additional conductive surfaces have to be provided as electrodes for manufacturing an electrode device according to various embodiments for detecting a position of an object relative to the electrode device. The printed circuit board may be designed such that the region of the printed circuit board, which comprises the electrode layers, reaches close to the housing of an electric handheld device, so that an approach towards the handheld device and the position of a finger at the handheld device, respectively, still may be detected assuredly in the region of the electrode configuration. The arrangement of the electrodes and the embodiment of the conductive layers of the printed circuit board forming the electrodes, respectively, is chosen such that the electrodes extend to at least one edge of the printed circuit board, as shown with respect to FIG. 9.

The capacitive coupling between the transmitting electrodes and the receiving electrodes is formed at the edge region of the printed circuit board. In the electrode devices shown in FIG. 2 to FIG. 8 the left, the upper and the lower edge of the electrodes each are in the area of the printed circuit board, so that only the right edge of the electrodes extends all the way to the edge of the printed circuit board. The ground electrode GND has a larger surface area than the transmitting electrodes and receiving electrodes, respectively, wherein the ground electrode GND is arranged such that it extends towards the edge of the printed circuit board with its right edge and the upper edge, the lower edge and the left edge extends over the transmitting electrodes and the receiving electrodes.

The areas of the printed circuit board LP labeled with FD are planes of a multi layer electronic printed circuit board, which may be left unoccupied for forming the electrode device according to various embodiments. Alternatively, the layout of the plane arranged below and above, respectively, may be copied and adopted, respectively, in these planes FD, i.e. an electrode layout according to the plane arranged below and above, respectively, also may be formed in these planes and may be operated in parallel with the electrodes of the plane arranged above and below, respectively.

FIG. 2 shows a first exemplary embodiment of an electrode device for a capacitive sensor device. In the upper drawing of FIG. 2 a top view onto a printed circuit board LP is shown, wherein only the receiving electrodes E1 and E2 and the ground electrode GND are shown. In the lower drawing of FIG. 2 a cross-sectional view along the cross section A-A is shown, wherein it becomes clear that the electrodes of the electrode device according to various embodiments are arranged one upon the other and spaced from each other in the printed circuit board LP.

The transmitting electrodes E3 and E4 each comprise a number of electrode segments spaced with respect to each other, which each are connected to each other electrically. The electrode segments of both transmitting electrodes E3 and E4 here are arranged side by side such that between each two adjacent electrode segments of the first transmitting electrode E3 an electrode segment of the second transmitting electrode E4 is arranged, i.e. the electrode segments of the first electrode E3 and the electrode segments of the second transmitting electrode E4 alternate with each other. The electrode segments of the transmitting electrodes E3 and E4 all are equal in width and each also have the same surface area. For example, the electrode segments of the electrodes E3 and E4 each may have a width of 2 mm, for example.

The receiving electrodes E1 and E2 also each comprise a number of electrode segments, which also are arranged side by side such that between each two adjacent electrode segments of the first receiving electrode E1 an electrode segment of the second receiving electrode E2 is arranged, i.e. also in the receiving electrode configuration the electrode segments of the first receiving electrode E1 and of the second receiving electrode E2 alternate with each other.

The grid pattern of the receiving electrodes E1, E2 substantially corresponds to the grid pattern of the transmitting electrodes E3 and E4, i.e. each of the electrode segments of the receiving electrodes E1 and E2 substantially lies exactly above an electrode segment of the transmitting electrodes E3 and E4. As can be seen from FIG. 2, the electrode segments of the receiving electrode E2 correspond with the electrode segments of the transmitting electrode E4 and the electrode segments of the receiving electrode E1 correspond with the electrode segments of the transmitting electrode E3.

The width of the electrode segments of the receiving electrode E2 is constant along the detection axis DA. Thereby the capacitive coupling between the transmitting electrode E4 and the receiving electrode E2 is independent of position, i.e. the transmitting electrode E4 together with the receiving electrode E2 forms an electrode device comprising a receiving electrode configuration of the first type.

The width of the electrode segments of the receiving electrode E1 decreases along the detection axis DA. This is to mean that a capacitive coupling between the transmitting electrode E3 and the receiving electrode E1 is higher in the left area of the electrode device than in the right area, which means that the capacitive coupling depends on position. Thereby the transmitting electrode E3 together with the receiving electrode E1 forms an electrode device comprising a receiving electrode configuration of the second type.

For example, when now a finger moves along the detection axis DA from left to right, the capacitive coupling between the transmitting electrode E3 and the receiving electrode E1 decreases, so that the position of the finger relative to the electrode device may be determined according to the above described calculation.

Arranged between the transmitting electrodes E3 and E4 and the receiving electrodes E1 and E2 is a ground electrode GND to substantially avoid a direct capacitive coupling between the transmitting electrodes and the receiving electrodes. This also is true for the electrode devices described in the following with respect to FIG. 3 to FIG. 8.

FIG. 3 shows a second exemplary embodiment of an electrode device. Design and arrangement, respectively, of the transmitting electrodes E3 and E4, as well as their function substantially correspond to as described with respect to FIG. 2. Contrary to the electrode device shown in FIG. 3 the receiving electrode configuration is formed by means of two receiving electrodes E1 and E2 of the second type, i.e. both receiving electrodes provide a position dependent measurement signal.

The grid pattern of the electrode segments of the two receiving electrodes E1 and E2 substantially corresponds to the grid pattern of the two transmitting electrodes E3 and E4.

Also here, the electrode segments of the first receiving electrode E1 alternate with electrode segments of the second receiving electrode E2. The width of the electrode segments of the first receiving electrode E1 decreases along the detection axis DA, while the width of the electrode segments of the second receiving electrode E2 increases along the detection axis DA. This means that the capacitive coupling between the transmitting electrode E3 and the receiving electrode E1 decreases from left to right, while the capacitive coupling between the transmitting electrode E4 and the receiving electrode E2 increases from left to right.

The calculation of the position is carried out as described with relation to FIG. 1.

Figure 4:
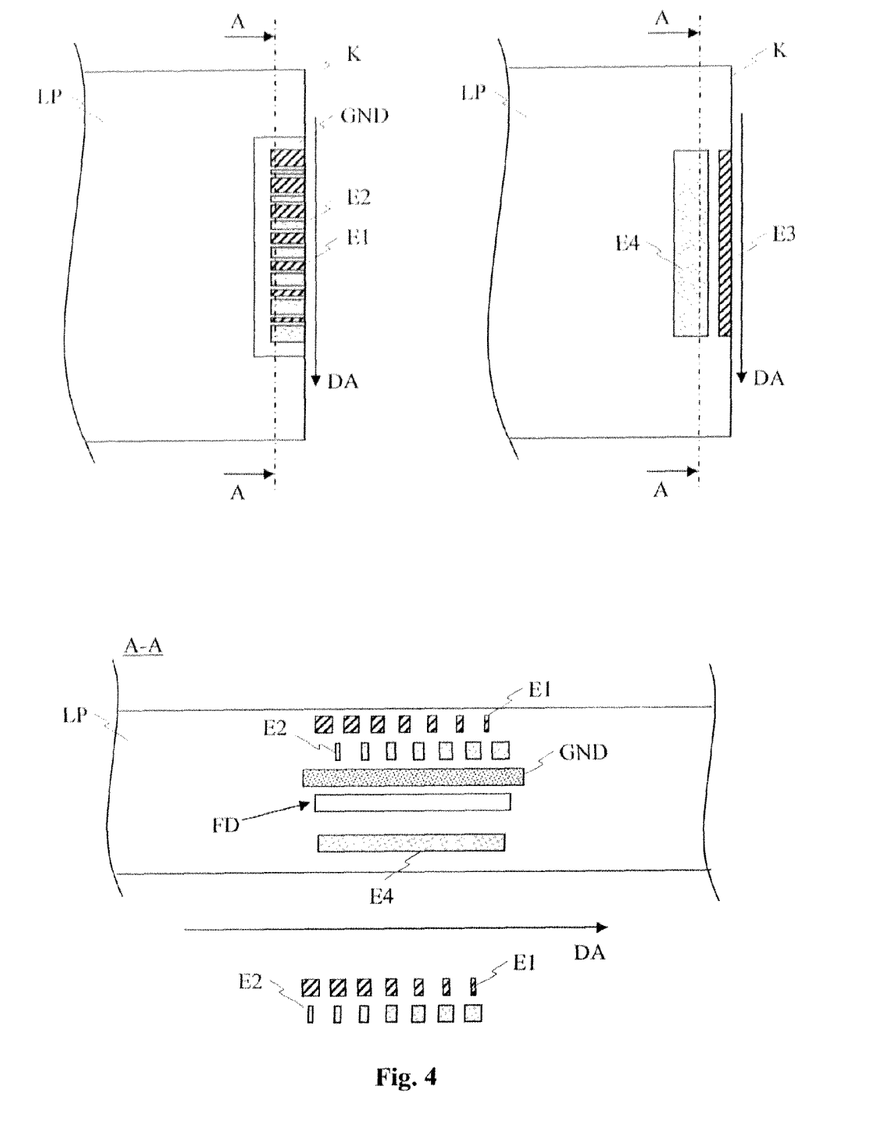
FIG. 4 shows a third exemplary embodiment of an electrode device.

FIG. 4 shows a third exemplary embodiment of an electrode device. In the drawing in the upper left of FIG. 4 a top view onto a printed circuit board LP is shown, wherein the receiving electrodes E1 and E2, as well as the ground electrode GND are visible. In the drawing in the upper right of FIG. 4 a lower plane of the printed circuit board LP is shown, in which the transmitting electrodes E3 and E4 are arranged. This means that the transmitting electrode E3 and the transmitting electrode E4 are arranged in one plane—thus they are formed by means of parts of the same electrically conductive layer of the printed circuit board.

As can be seen in FIG. 4 the first transmitting electrode E3 is arranged directly at the edge of the printed circuit board LP, while the transmitting electrode E4 has a certain distance from the edge K of the printed circuit board LP. In addition, the electrode surface area of the first transmitting electrode E3 is significantly smaller than the electrode surface area of the second transmitting electrode E4. By means of this configuration it is accomplished substantially that the transmitting electrode E3 couples with the receiving electrodes E1 and E2 over the edge K of the printed circuit board LP. By means of the distance of the transmitting electrode E4 from the edge K of the printed circuit board LP it is accomplished that the transmitting electrode E4 couples less with the receiving electrodes E1 and E2, but more with the finger approaching towards the edge K.

By means of the larger distance of the transmitting electrode E4 from the edge K of the printed circuit board LP and the larger surface area of the transmitting electrode E4 it is accomplished that the capacitive coupling of the transmitting electrode E4 with a finger substantially has the same magnitude as the capacitive coupling of E3 with the finger. As a result of the inversely phased activation of the two transmitting electrodes E3 and E4 it is accomplished thereby that the two couplings with the finger substantially neutralize each other, whereby a capacitive sensor is provided, which virtually provides the same results with grounded and non-grounded sensor electronics.

The electrode segments of the receiving electrode E1 and the receiving electrode E2 substantially are formed as shown in FIG. 3. While in the electrode configuration of FIG. 3 the electrode segments of the receiving electrodes E1 and E2 are arranged in the same plane, the electrode segments of the receiving electrode E1 in FIG. 4 are arranged above the electrode segments of the second receiving electrode E2, i.e. the receiving electrode E1 is arranged in a plane above the receiving electrode E2. The electrode segments of the second receiving electrode E2 may be arranged relative to the electrode segments of the first receiving electrode E1 such that they substantially lie "between" the electrode segments of the first receiving electrode E1. Alternatively, as shown at the bottom in FIG. 4, the electrode segments of the first receiving electrode E1 also may be arranged in a grid pattern equal to that of the electrode segments of the receiving electrode E2.

Here, the receiving electrode configuration is formed by two receiving electrodes of the second type. The calculation of the position of an object relative to the electrode device is carried out as described with relation to FIG. 1.

Figure 5:
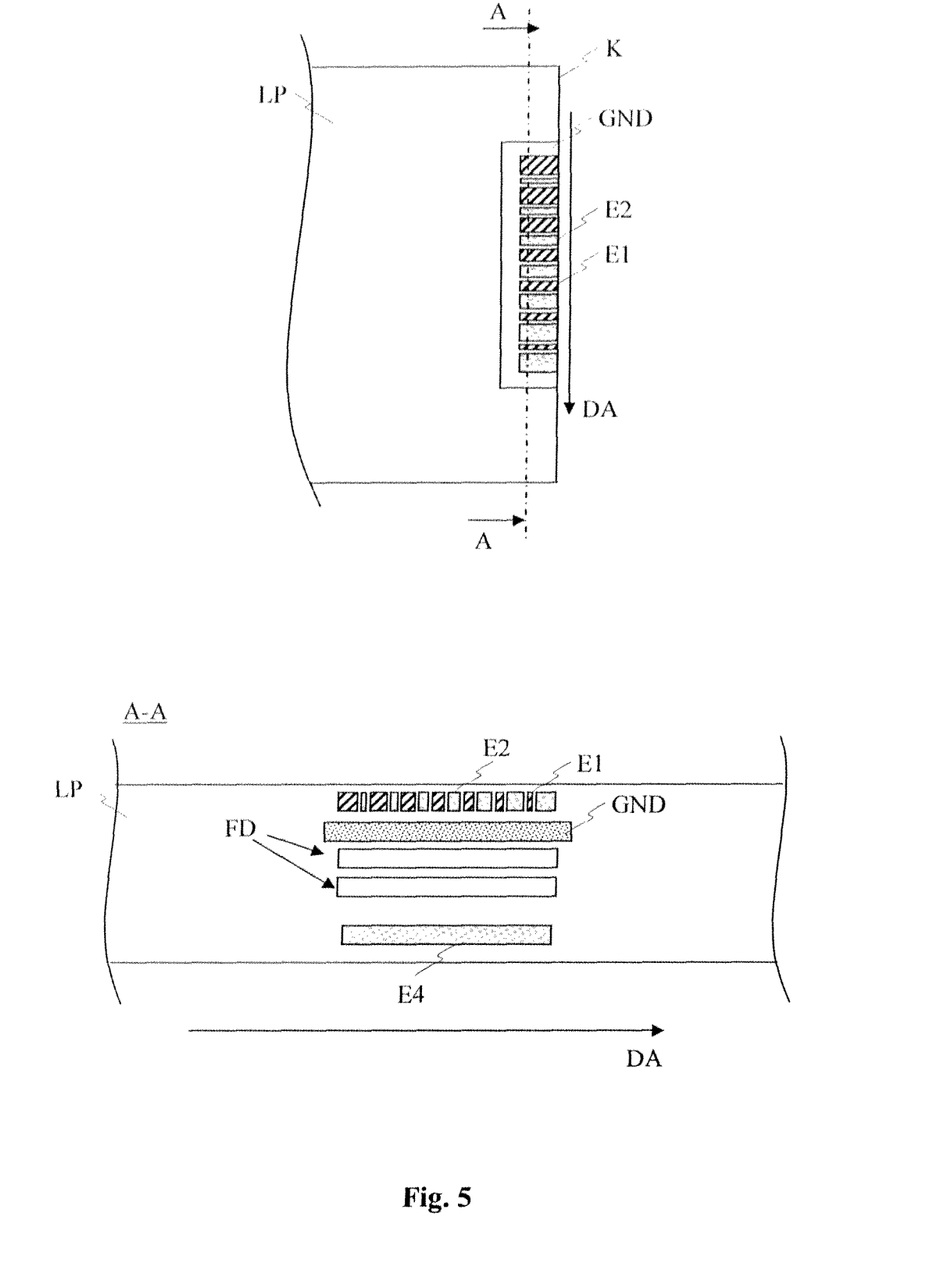
FIG. 5 shows a fourth exemplary embodiment of an electrode device.

FIG. 5 shows a fourth exemplary embodiment of an electrode device. The embodiment and arrangement, respectively, of the transmitting electrode E3 and E4 in this case substantially corresponds to the embodiment and arrangement as shown in FIG. 4. The embodiment and arrangement, respectively, of the receiving electrodes E1 and E2 here substantially corresponds to the embodiment and arrangement as shown in FIG. 3. This means that the receiving electrodes E1 and E2 are arranged in one plane and the transmitting electrodes E3 and E4 are arranged in one plane.

Figure 6:
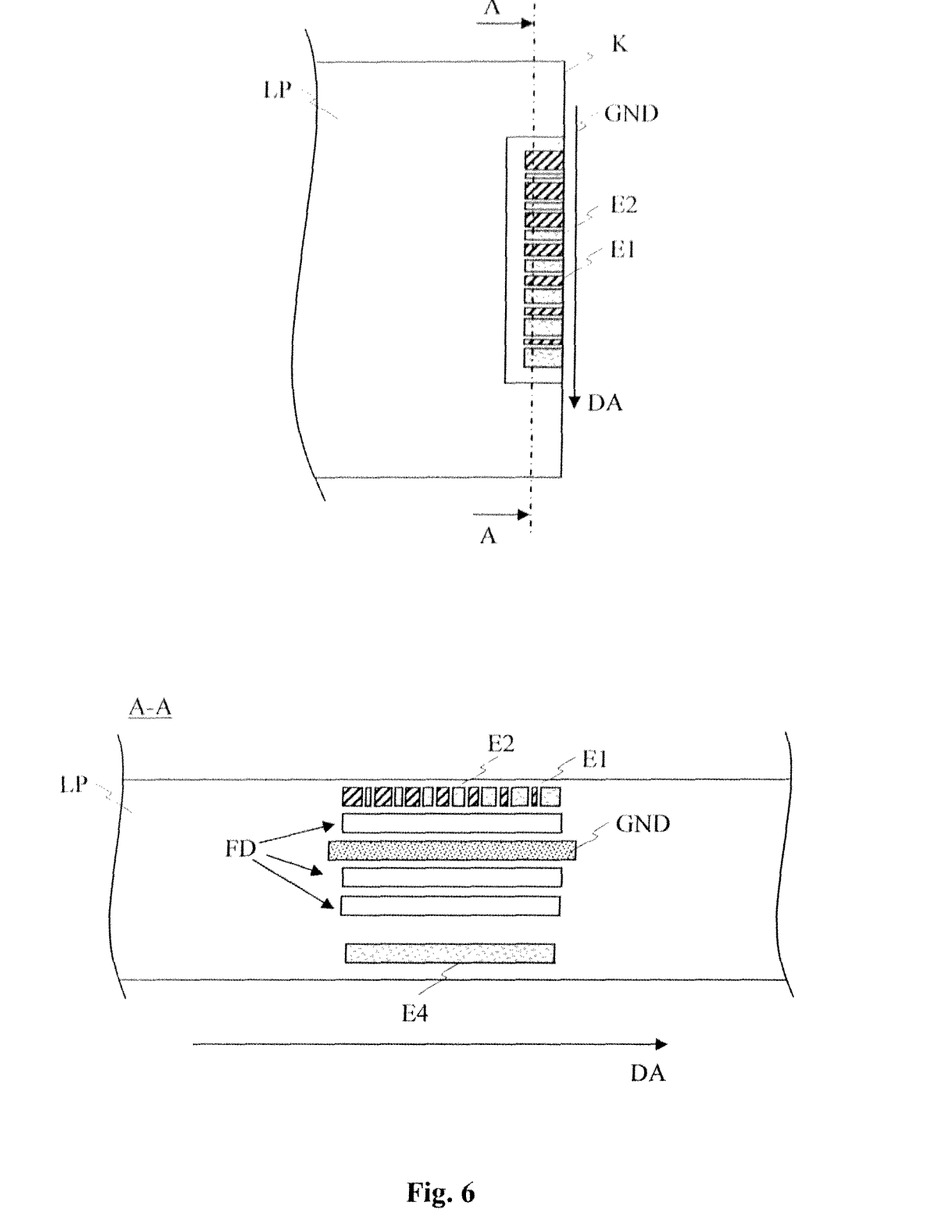
FIG. 6 shows a fifth exemplary embodiment of an electrode device.

FIG. 6 shows a fifth exemplary embodiment of an electrode device. The embodiment and arrangement of the receiving electrodes and the transmitting electrodes here substantially corresponds to the embodiment and arrangement as shown with relation to FIG. 5. However, in contrast to the arrangement of FIG. 5 between the receiving electrodes E1, E2 and the ground electrode GND a further plane is provided, in which, for example, a copy of the receiving electrodes E1, E2 may be provided and may be arranged electrically in parallel with the electrodes E1 and E2 of the uppermost plane. The mode of operation of the electrode device of FIG. 6 substantially corresponds to the mode of operation of the electrode device of FIG. 5. FIG. 5 as well as also FIG. 6 comprises two receiving electrodes of the second type. The detection of the position of an object relative to the electrode device is carried out as described with relation to FIG. 1.

Figure 7:
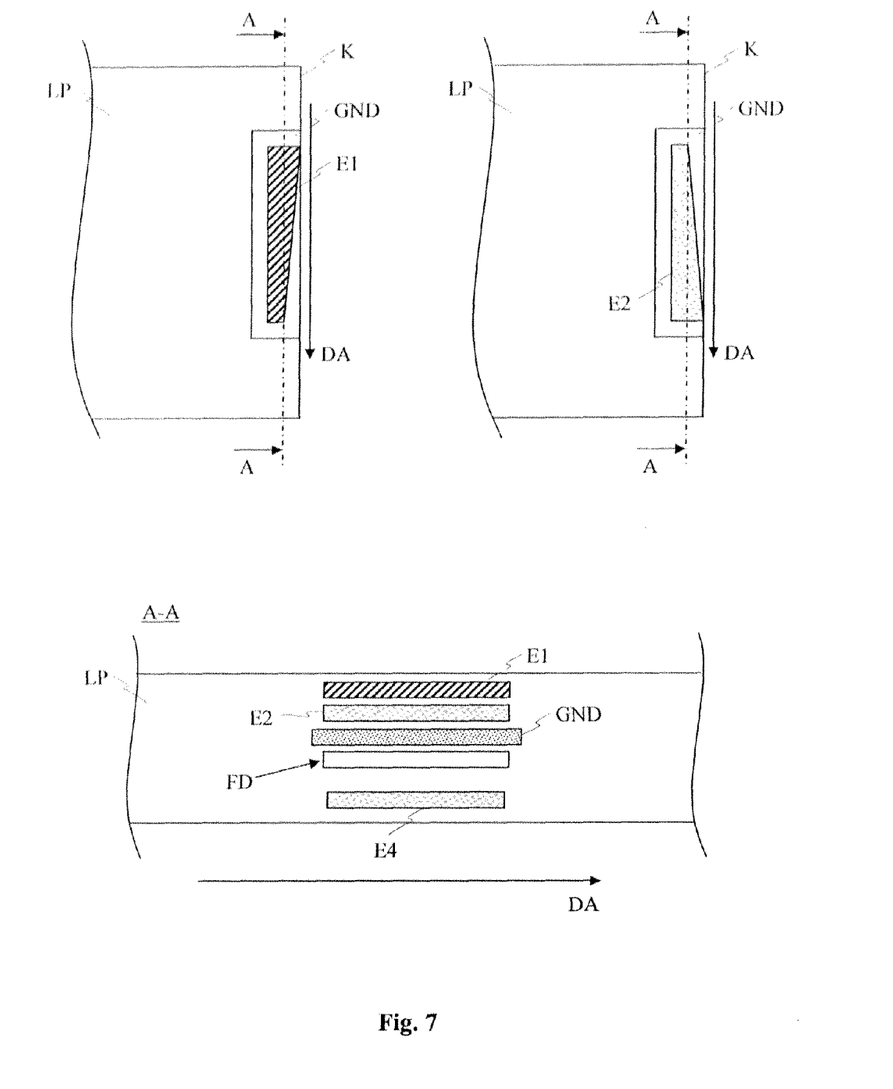
FIG. 7 shows a sixth exemplary embodiment of an electrode device.

FIG. 7 shows a sixth exemplary embodiment of an electrode device. The embodiment and arrangement of the transmitting electrodes E3 and E4 here substantially corresponds to the embodiment and arrangement as described with relation to FIG. 6 and FIG. 5.

Contrary to the above described exemplary embodiments the receiving electrodes E1 and E2 of the receiving electrode configuration each are formed in one piece. Both receiving electrodes are arranged at the edge of the printed circuit board LP, wherein the distance of the first receiving electrode E1 from the edge K of the printed circuit board LP increases along the detection axis DA, and wherein the distance of the second receiving electrode E2 from the edge K of the printed circuit board LP decreases along the detection axis DA. The receiving electrodes E1 and E2 arranged such thereby each form a receiving electrode of the second type.

In the example shown here the receiving electrodes E1 and E2 are formed wedge-shaped, wherein the width of the receiving electrode E1 decreases along the detection axis DA and wherein the width of the receiving electrode E2 increases along the detection axis DA. Instead of the wedge-shaped design of the receiving electrodes E1, E2 also two strip-shaped receiving electrodes may be provided, which have the same width along the entire length. It is only important that the distance of the receiving electrodes from the edge K of the printed circuit board LP increases and decreases, respectively, along the detection axis.

The receiving electrodes E1 and E2 also may be combined with the transmitting electrodes E3, E4 shown in FIG. 2 and FIG. 3, respectively.

By means of the changing distance of the receiving electrodes E1, E2 from the edge K of the printed circuit board LP also the capacitive coupling between the receiving electrode E1, E2 and an approaching finger changes along the detection axis DA so that the two electrodes E1, E2 each form a receiving electrode of the second type. The calculation of the position of a finger relative to the electrode device is carried out as described with relation to FIG. 1.

FIG. 8 shows a seventh exemplary embodiment of an electrode device. Besides the embodiment of the first transmitting electrode E1 the electrode configuration shown in FIG. 8 substantially corresponds to the electrode configuration shown in FIG. 7.

Here, the first receiving electrode E1 substantially is formed rectangular and strip-shaped, respectively, and extends over the entire length all the way to the edge K of the printed circuit board LP. This means that the distance of the first receiving electrode E1 from the edge K of the printed circuit board LP remains constant along the detection axis DA, while the distance of the second receiving electrode E2 from the edge K of the printed circuit board LP decreases along the detection axis DA. Thereby, the first receiving electrode E1 forms a receiving electrode of the first type and the receiving electrode E2 forms a receiving electrode of the second type.

The calculation of the position of a finger approaching the electrode device is carried out as described with relation to FIG. 1.

Figure 9:
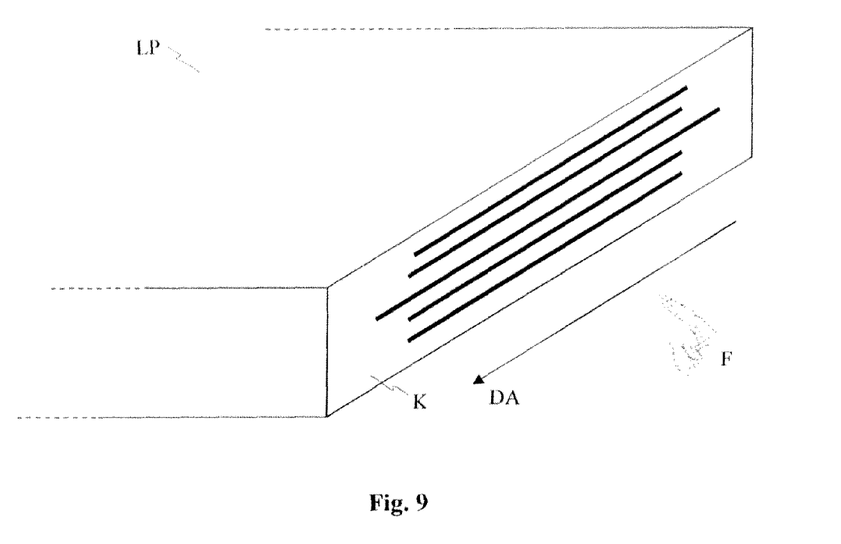
FIG. 9 shows a perspective view of a part of a printed circuit board comprising electrodes located at the edge, which are formed by parts of the electrically conductive layers of the printed circuit boards.

FIG. 9 shows an area at the edge of a printed circuit board LP in a perspective view to illustrate that the electrodes of the electrode device extend all the way to the edge K of the printed circuit board LP.

Figure 10:
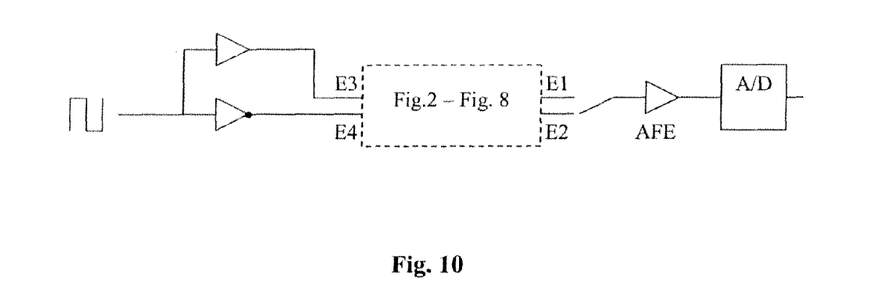
FIG. 10 shows a principle circuit diagram for activating electrode devices according to various embodiments.

FIG. 10 shows a simplified diagram for the activation of an electrode device according to various embodiments, in particular an electrode device of FIG. 2 to FIG. 8.

A square wave generator, for example with 100 kHz, activates two driver components at the output of which then two generator signal +Tx and −Tx shifted in phase by 180° are present, which are applied to the transmitting electrodes E3, E4. The measurement signal—a capacitive current and alternating current, respectively—is tapped at the receiving electrodes E1, E2, fed to an Analog Front End AFE and is amplified and processed in the Analog Front End AFE, for example is high-pass and/or low-pass filtered. The amplified and processed signal subsequently is digitized in an analog to digital converter A/D and is fed to a digital signal processing not shown in more detail.

All of the electrode devices shown with relation to FIG. 2 to FIG. 8 are carried out such that always two transmitting electrodes E3, E4 may be activated simultaneously and with signals shifted in phase by 180° with respect to each other (i.e. inverted signals).

However, it is also feasible to activate the electrode devices using only one transmit signal +Tx or −Tx. In particular with the electrode devices of FIG. 4 to FIG. 8 the second transmitting electrode E4 may be omitted. In doing so, the dependency of a grounding state of an electric device, for which the capacitive sensor device is provided, may increase.

This disadvantage, however, can be put up with when the grounding state of the capacitive sensor device and of an electric device, respectively, does not change, which in particular then is the case when the device and the capacitive sensor device, respectively, always is operated with a battery or with a power supply.

The various embodiments involves several substantial advantages:

The electrodes of the electrode device directly can be integrated into a printed circuit board. Preferably, so called multi layer printed circuit boards (multi layer PCB) are selected, which at least have three electrically conductive layers, wherein in a lower layer the transmitting electrodes, in an upper layer the receiving electrodes and in a middle layer the ground electrode may be arranged and may be formed by parts of the respective electrically conductive layer.

A further advantage is that by means of loading the two transmitting electrodes E3, E4 with an inverse signal an independency of the grounding characteristics of the capacitive sensor device is ensured to the greatest possible extent.

In addition it is feasible to form the printed circuit board, in particular that area of the printed circuit board in which the electrodes of the electrode device according to various embodiments are arranged, as a flexible printed circuit board.

The above described capacitive sensor systems and electrode configurations as well as modifications therefrom according to various embodiments may be provided in electric devices, in particular electric handheld devices, in order to equip the handheld devices with additional user interfaces and man-machine-interfaces, respectively. The electric device and electric handheld device, respectively, may be a smart phone, a mobile radio device, a computer mouse, a device remote control, a digital camera, a game controller, a mobile mini-computer, a tablet-PC, a dictating device, a media player or the like.

What is claimed is:

1. An electrode device for a capacitive sensor device for detecting a position of an object relative to the electrode device, wherein the electrode device comprises a transmitting electrode configuration, a receiving electrode configuration and at least one ground electrode, wherein
   the transmitting electrode configuration, the receiving electrode configuration and the at least one ground electrode are each arranged in separate layers above each other, respectively and spaced apart from each other,
   at least one ground electrode is arranged between the transmitting electrode configuration and the receiving electrode configuration, and
   the transmitting electrode configuration comprises a first transmitting electrode, which is configured to receive a first electric alternating signal and wherein the receiving electrode configuration comprises a first receiving electrode configured to receive a signal transmitted by the first transmitting electrode,
   wherein the transmitting electrode configuration, the receiving electrode configuration and the at least one ground electrode are formed by parts of electrically conductive layers of a printed circuit board having a plurality of edges and are all arranged within a region of one of the edges so that an edge surface of the printed circuit board forms a capacitive sensor surface and a capacitive coupling between the transmitting electrode configuration and the receiving electrode configuration is influenced by an object approaching the sensor surface.

2. The electrode device of claim 1, wherein the transmitting electrode configuration comprises a second transmitting electrode configured to receive a second electric alternating signal.

3. The electrode device of claim 2, wherein the first electric alternating signal applied to the first transmitting electrode is inverse with respect to the second electric alternating signal applied to the second transmitting electrode.

4. The electrode device of claim 2, wherein the first transmitting electrode and the second transmitting electrode are arranged within one layer and each comprise a number of electrode segments spaced apart from each other and connected to each other electrically, wherein the electrode segments of both transmitting electrodes are arranged side by side in an alternating fashion.

5. The electrode device of claim 4, wherein the electrode segments of the two transmitting electrodes have the same form and the same surface area.

6. The electrode device of claim 2, wherein the first transmitting electrode is arranged in the same layer as the second transmitting electrode and spaced from the second transmitting electrode.

7. The electrode device of claim 6, wherein the first transmitting electrode has a lesser electrode surface area than the second transmitting electrode.

8. The electrode device of claim 6, wherein a first distance of the first transmitting electrode from an edge of a printed circuit board is smaller than a second distance of the second transmitting electrode from the edge of the printed circuit board.

9. The electrode device of claim 1, wherein the receiving electrode configuration comprises at least one first receiving electrode and one second receiving electrode.

10. The electrode device of claim 9, wherein the first receiving electrode and the second receiving electrode each comprise a number of electrode segments spaced from each other, wherein the electrode segments of both receiving electrodes are arranged side by side in an alternating fashion.

11. The electrode device of claim 10, wherein the width of the electrode segments of the first receiving electrode decreases along a detection axis and wherein the electrode segments of the second receiving electrode each have the same width.

12. The electrode device of claim 10, wherein the width of the electrode segments of the first receiving electrode decreases along a detection axis and wherein the width of the electrode segments of the second receiving electrode increases along the detection axis.

13. The electrode device of claim 10, wherein the first receiving electrode and the second receiving electrode are arranged within one layer.

14. The electrode device of claim 10, wherein the first receiving electrode and the second receiving electrode are arranged above each other.

15. The electrode device of claim 9, wherein the first receiving electrode is arranged in a layer above the second receiving electrode and spaced apart from the second receiving electrode.

16. The electrode device of claim 15, wherein the distance of the first receiving electrode from a detection edge decreases along a detection axis.

17. The electrode device of claim 15, wherein a first distance of the first receiving electrode from a detection edge decreases and a second distance of the second receiving electrode increases along a detection axis.

18. The electrode device of claim 1, wherein an area within a layer of the printed circuit board of the at least one ground electrode is larger than a respective area of the transmitting electrode configuration and larger than a respective area of the receiving electrode configuration.

19. The electrode device of claim 1, at least one of the electrodes reaches all the way to a completion edge of the printed circuit board.

20. A printed circuit board comprising an electrode device of claim 1, wherein the electrodes of the electrode device each are arranged directly one upon the other.

21. The electrode device of claim 1, wherein the printed circuit board comprises layers that do not comprise any electrodes.

22. An electric handheld device comprising a printed circuit board of claim 1.

23. The electrode device of claim 1, wherein the electrodes extend along a detection axis and wherein the at least one ground electrode extends longer in the direction of the detection axis.

* * * * *